(12) United States Patent
Hommi et al.

(10) Patent No.: US 11,670,481 B2
(45) Date of Patent: Jun. 6, 2023

(54) CHARGED PARTICLE BEAM DEVICE

(71) Applicant: Hitachi High-Tech Corporation, Tokyo (JP)

(72) Inventors: Motonobu Hommi, Tokyo (JP); Satoru Yamaguchi, Tokyo (JP); Kei Sakai, Tokyo (JP); Hiroshi Nishihama, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/449,286

(22) Filed: Sep. 29, 2021

(65) Prior Publication Data

US 2022/0165537 A1 May 26, 2022

(30) Foreign Application Priority Data

Nov. 26, 2020 (JP) .............................. JP2020-195611

(51) Int. Cl.
*H01J 37/28* (2006.01)
*H01J 37/22* (2006.01)
*H01J 37/244* (2006.01)

(52) U.S. Cl.
CPC ............ *H01J 37/28* (2013.01); *H01J 37/222* (2013.01); *H01J 37/244* (2013.01); *H01J 2237/221* (2013.01); *H01J 2237/2817* (2013.01)

(58) Field of Classification Search
CPC .. H01J 37/00; H01J 37/02; H01J 37/26; H01J 37/28; H01J 37/22; H01J 37/222; H01J 37/244; H01J 37/263; H01J 37/265; H01J 2237/221; H01J 2237/2817; G06T 7/0004; G06T 2207/10061; G06T 2207/30148

USPC .......................................... 250/306, 307, 311
See application file for complete search history.

(56) References Cited

U.S. PATENT DOCUMENTS

| 9,569,836 | B2 | 2/2017 | Hirai et al. | |
|---|---|---|---|---|
| 10,395,362 | B2 | 8/2019 | Gupta et al. | |
| 2005/0146714 | A1* | 7/2005 | Kitamura | G06T 7/0004 |
| | | | | 356/237.2 |
| 2012/0070089 | A1* | 3/2012 | Yamada | G06V 10/772 |
| | | | | 382/209 |

(Continued)

FOREIGN PATENT DOCUMENTS

| CN | 104937369 A | 9/2015 |
|---|---|---|
| CN | 110494894 A | 11/2019 |

(Continued)

OTHER PUBLICATIONS

Taiwanese-language Office Action issued in Taiwan Application No. 110136904 dated Apr. 22, 2022 with English translation (seven (7) pages).

*Primary Examiner* — Jason L McCormack
(74) *Attorney, Agent, or Firm* — Crowell & Moring LLP

(57) ABSTRACT

To shorten a time required for evaluation of a recipe while suppressing an increase in a data amount. A charged particle beam device includes a microscope that scans a charged particle beam on a sample, detects secondary particles emitted from the sample, and outputs a detection signal and a computer system that generates a frame image based on the detection signal and processes an image based on the frame images. The computer system calculates a moment image between a plurality of the frame images, and calculates a feature amount data of the frame image based on a moment.

14 Claims, 15 Drawing Sheets

(56) References Cited

U.S. PATENT DOCUMENTS

2019/0079022 A1* 3/2019 Shabtay ............. G01N 21/8851
2019/0392575 A1* 12/2019 Huotilainen .............. G06T 5/20

FOREIGN PATENT DOCUMENTS

| JP | 2004-185259 A | 7/2004 |
| JP | 2005-274157 A | 10/2005 |
| JP | 2011-174757 A | 9/2011 |
| JP | 2014-130026 A | 7/2014 |

* cited by examiner

[FIG. 1]
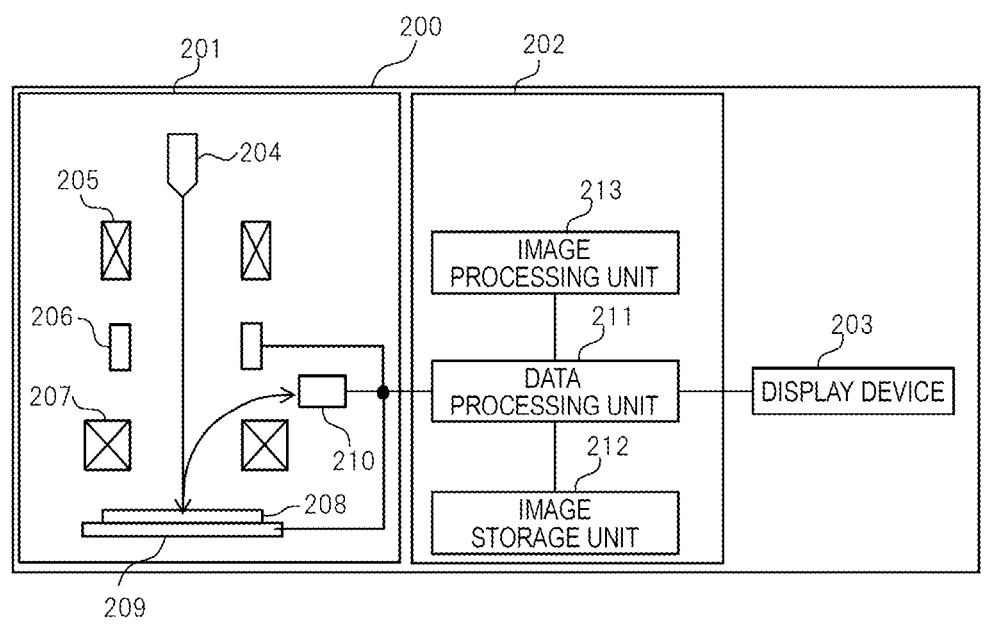
[FIG. 2]
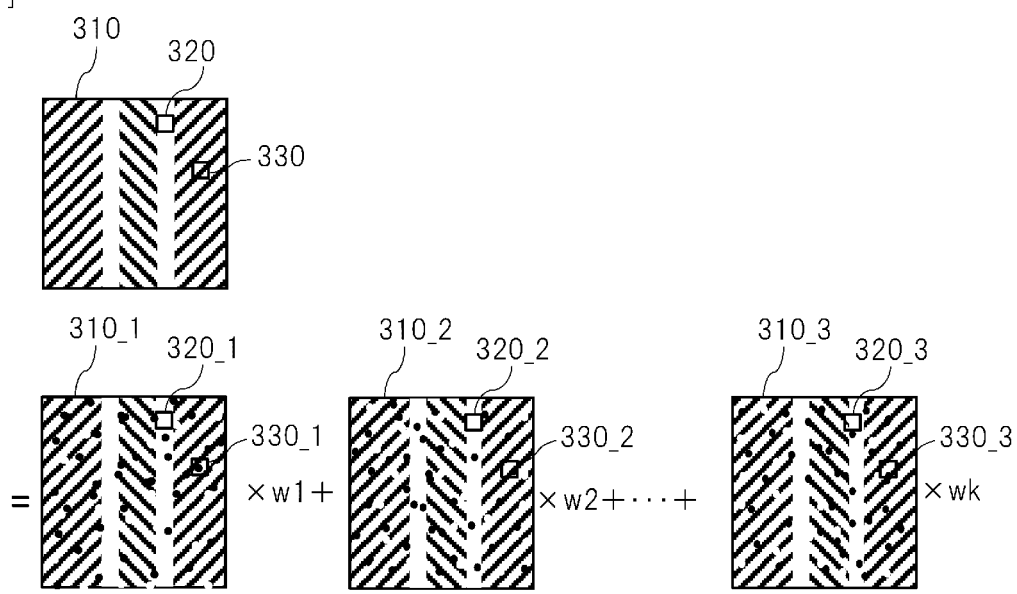

[FIG. 3]
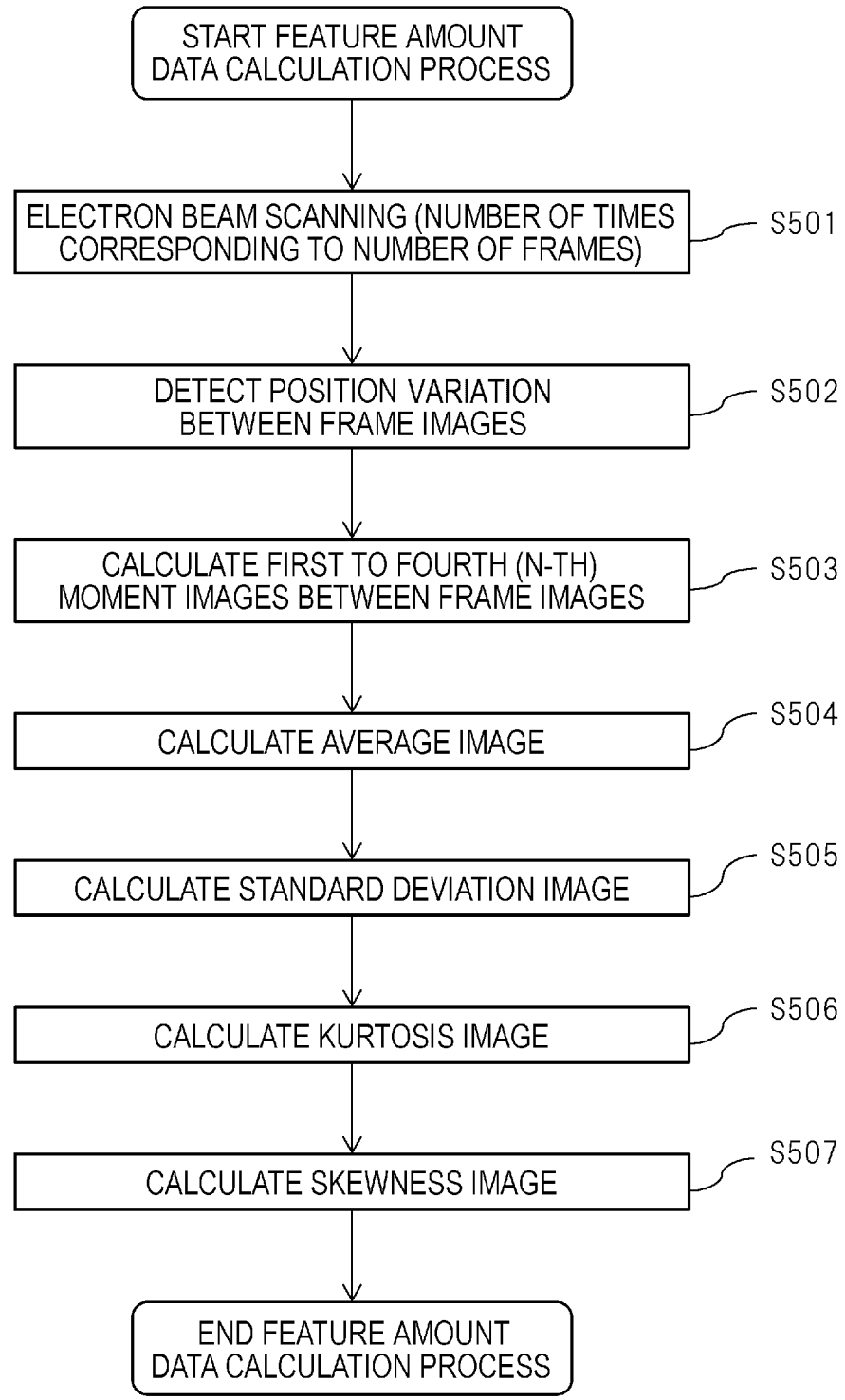

PSEUDO IMAGE   AVERAGE IMAGE   STANDARD DEVIATION IMAGE   RANDOM NUMBER IMAGE

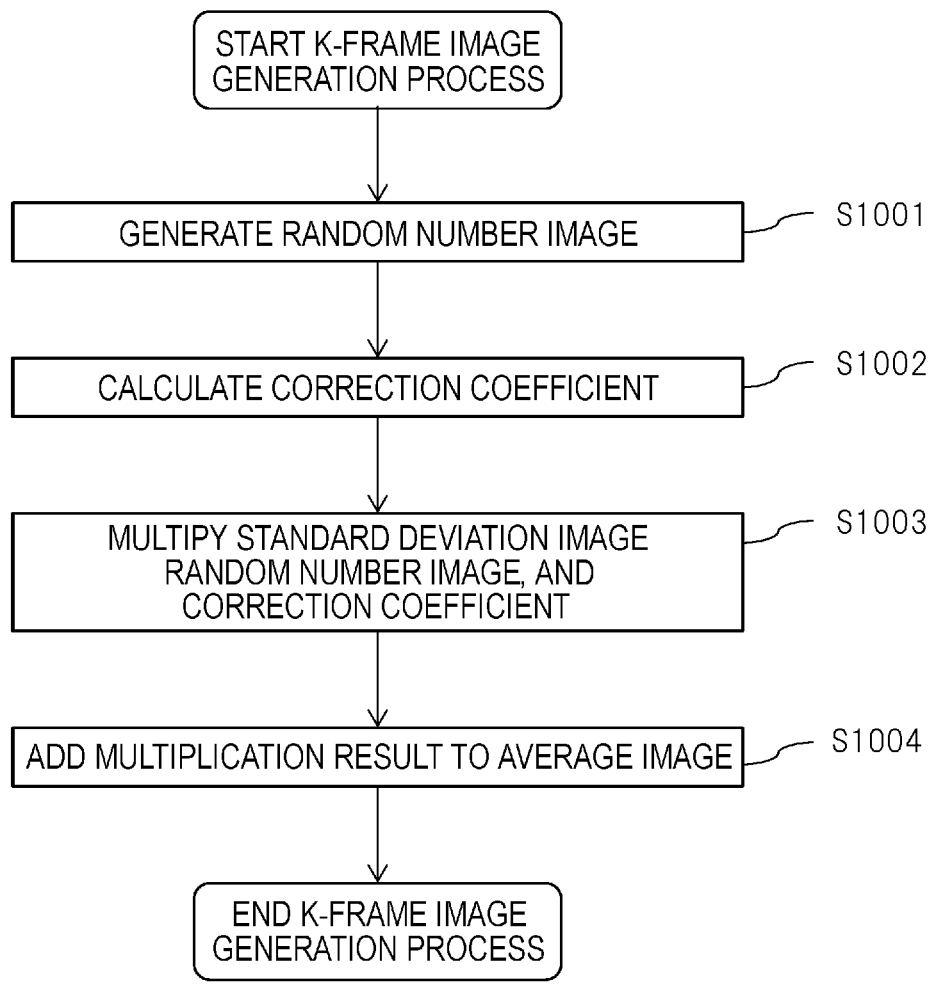

START OF ELECTRON
BEAM SCANNING

⇩

MIDDLE OF ELECTRON
BEAM SCANNING

⇩

END OF ELECTRON
BEAM SCANNING

[FIG. 10]
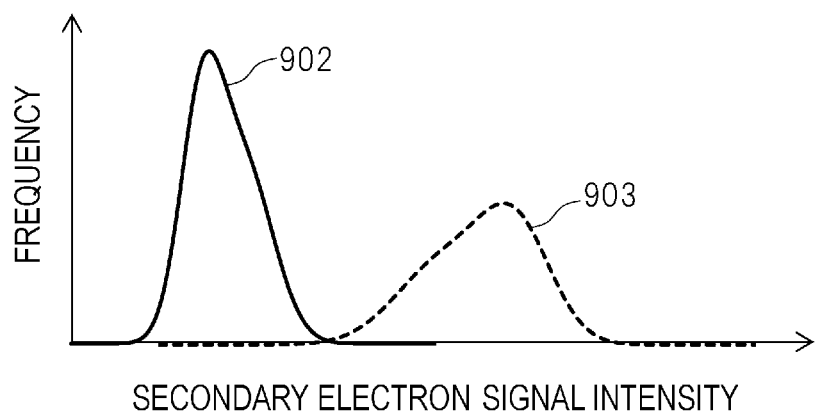

[FIG. 11]
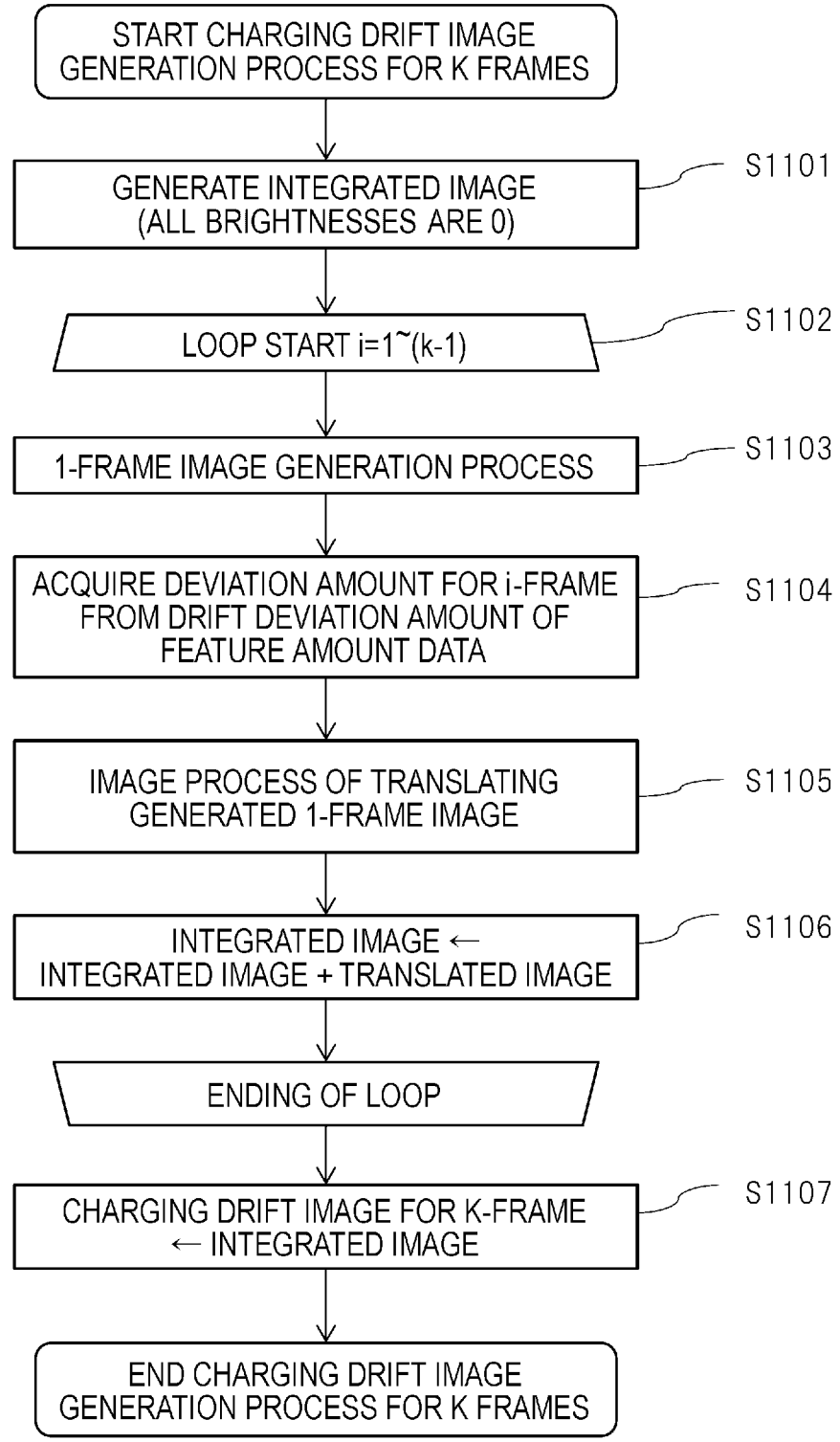

[FIG. 12]
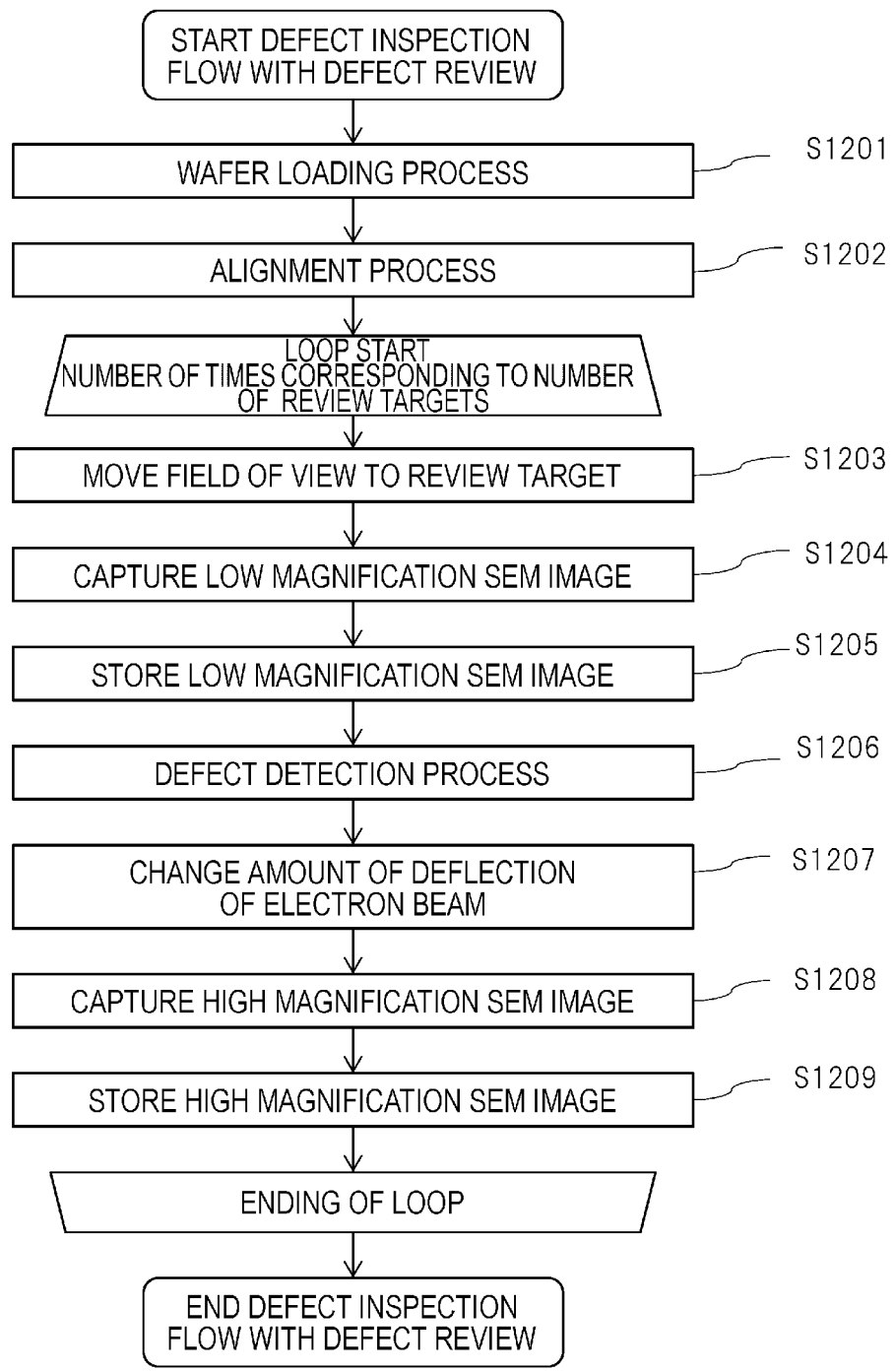

[FIG. 13]
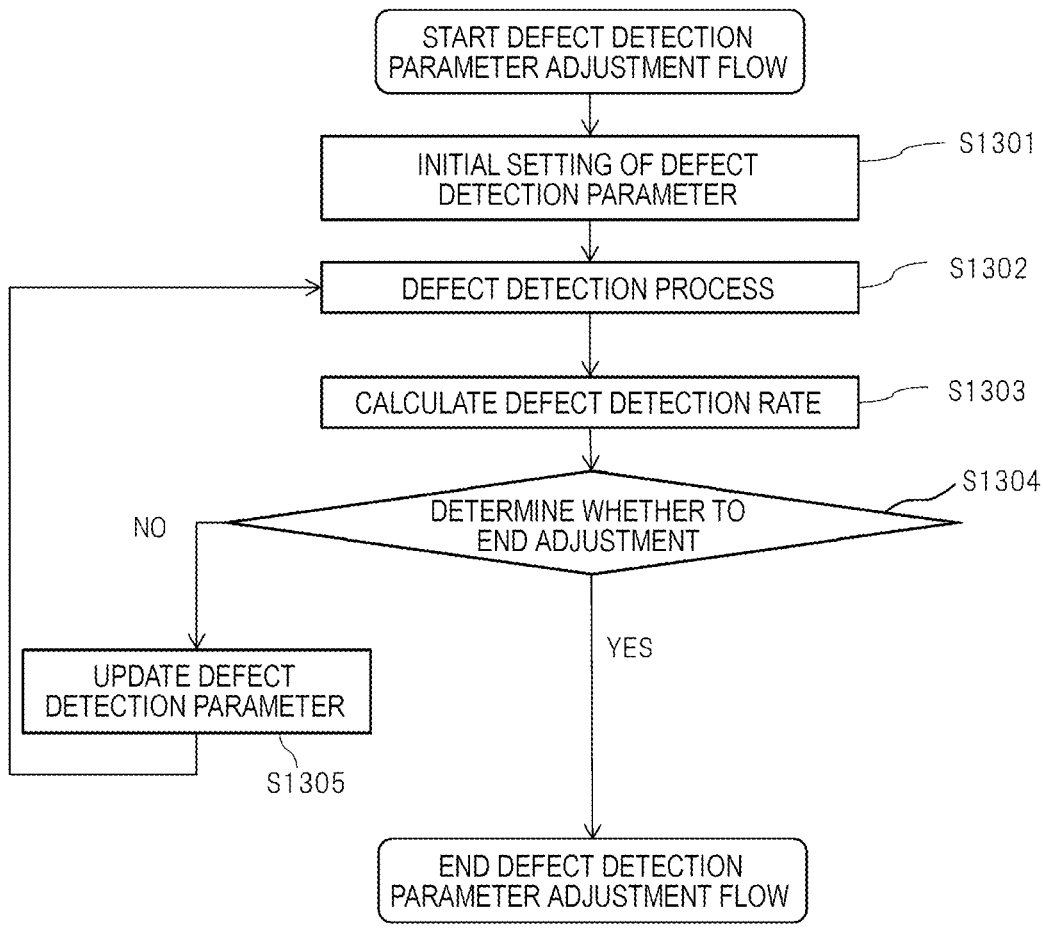

[FIG. 14]
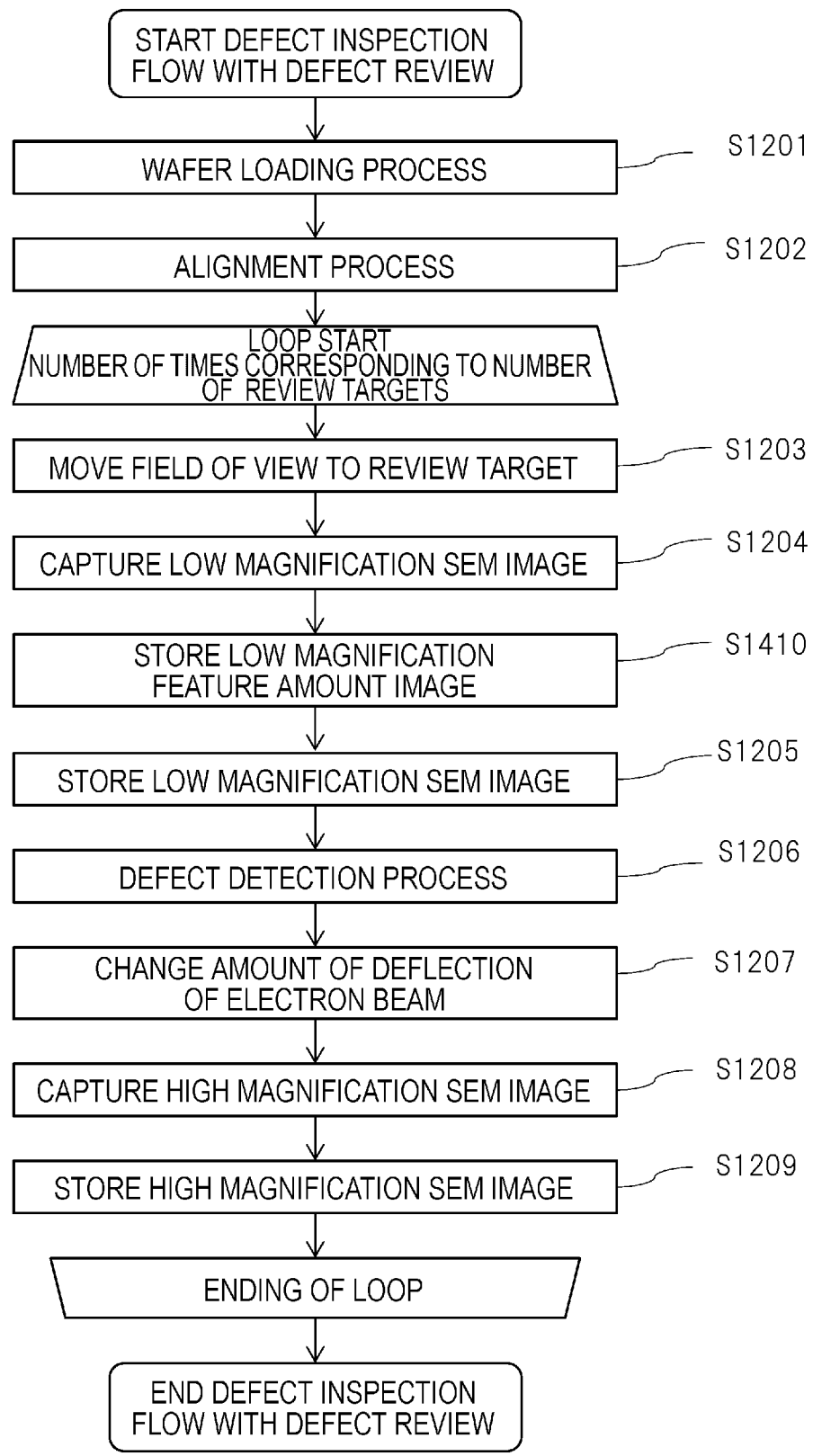

[FIG. 15]
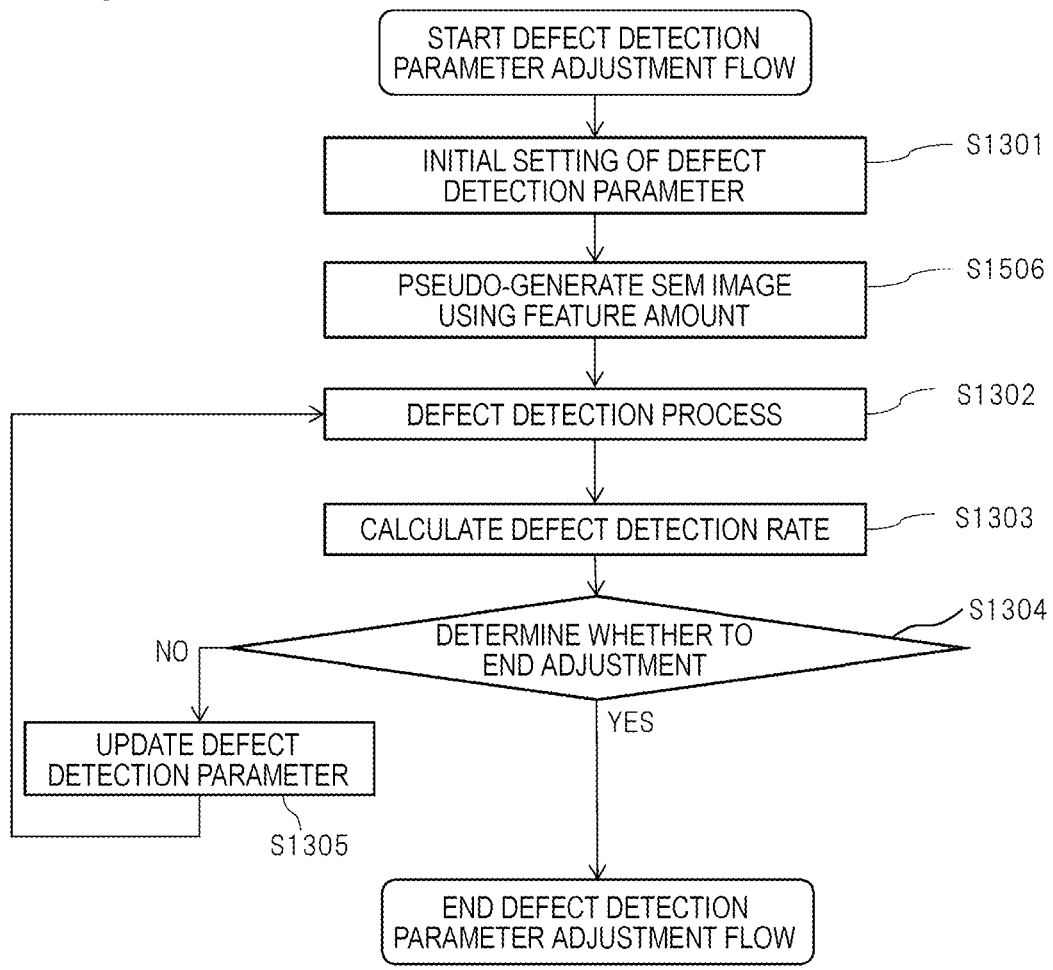

[FIG. 16]
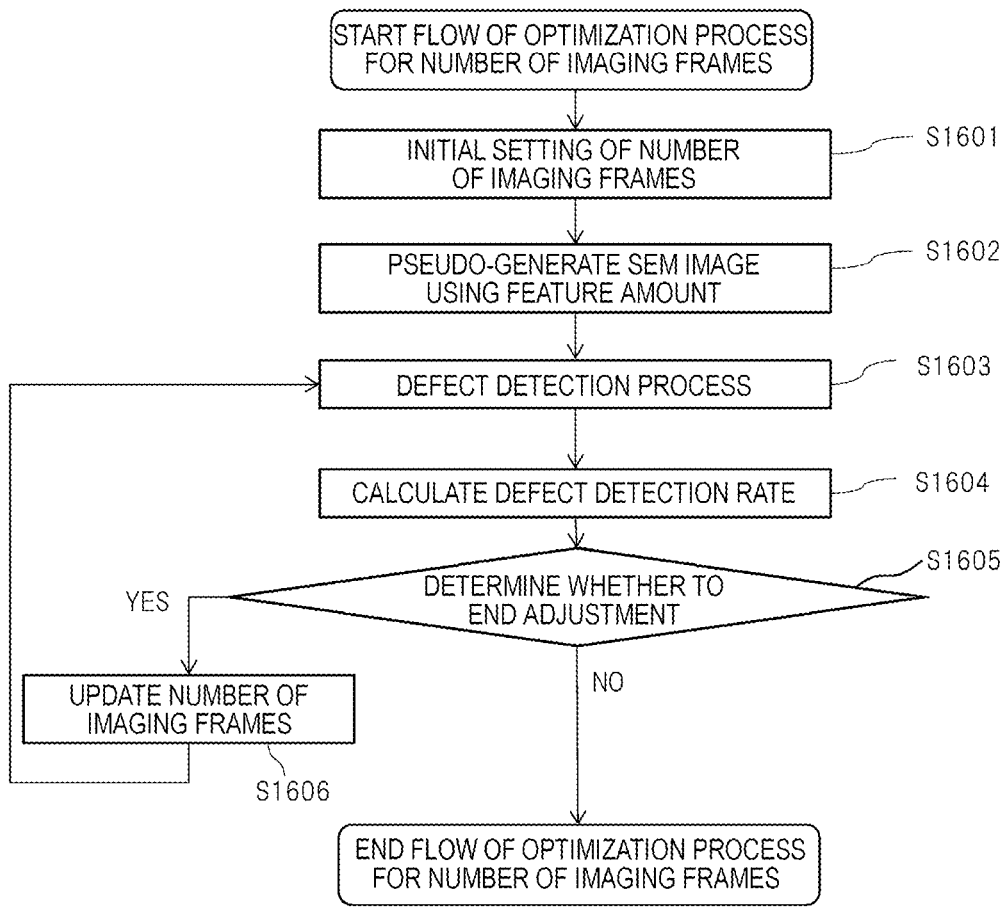

CHARGED PARTICLE BEAM DEVICE

TECHNICAL FIELD

The present disclosure relates to a charged particle beam device.

BACKGROUND ART

Semiconductor devices have larger sizes and are highly integrated. On the other hand, with the miniaturization of semiconductor devices, semiconductor inspection devices using charged particle beams have been required to improve a measurement accuracy and an inspection accuracy of the semiconductor devices.

A scanning electron microscope (SEM), which is one of the semiconductor inspection devices, irradiates a sample such as a semiconductor device with an electron beam and generates an image by detecting secondary electrons emitted from the sample.

In addition, as other semiconductor inspection devices, for example, a CD-SEM (Critical Dimension SEM), a DR-SEM (Defective Review SEM), or the like is used. In the CD-SEM, the dimensions of a semiconductor circuit pattern are measured by using a scanning electron microscope. In the DR-SEM, various defects and foreign substances in semiconductor circuits are inspected and observed.

For example, JP-A-2014-130026 (PTL 1) discloses a method for generating a low-magnification reference image based on an average brightness value calculated from a low-magnification defect image and detecting a difference region of the images as a defective region. JP-A-2005-274157 (PTL 2) discloses a method for suppressing detection of pseudo defects without being affected by large fluctuations in the brightness value by obtaining a brightness average image and a brightness standard deviation image from a plurality of non-defective product reference images and using a reference image generated based on the images.

JP-A-2004-185259 (PTL 3) discloses a method for calculating an average image and a standard deviation image and inspecting an outer appearance image. JP-A-2011-174757 (PTL 4) discloses a method for acquiring a plurality of inspection target images and updating a reference image of an inspection recipe based on an average image and a standard deviation image.

CITATION LIST

Patent Literature

PTL 1: JP-A-2014-130026
PTL 2: JP-A-2005-274157
PTL 3: JP-A-2004-185259
PTL 4: JP-A-2011-174757

SUMMARY OF INVENTION

Technical Problem

When a new semiconductor manufacturing process is introduced, a recipe defining a process procedure of a device is generated in order to acquire images of a target measurement pattern, foreign substances, and defect pattern. In a recipe, imaging conditions including an acceleration voltage of particles (for example, electrons), a probe current, a size (frame image size) of a field of view, and a frame integration number, a pattern recognition parameter for specifying a position of a target measurement pattern, and the like are required to be optimized.

However, in the optimization of the recipe, since it is necessary to repeatedly execute the recipe under various imaging conditions to optimize the imaging conditions and the parameters, it takes a lot of time to evaluate the recipe, and the data amount related to the evaluation of the recipe increases.

Therefore, the present disclosure is to provide a charged particle beam device capable of shortening the time required for evaluation of the recipe while suppressing an increase in the data amount.

Solution to Problem

The overview of typical disclosures in the present application is as follows. The charged particle beam device according to a typical embodiment of the present disclosure has a microscope that scans a charged particle beam with respect to a sample, detects secondary particles emitted from the sample, and outputs a detection signal. It includes a computer system that generates a frame image based on the frame image and performs image processing based on the detection signal. The computer system calculates a moment image between a plurality of the frame images and calculates a feature amount data of the frame images based on the moment.

Advantageous Effects of Invention

Among the disclosures of the present application, the effects obtained by the representative ones are briefly explained as follows.

That is, according to the typical embodiment of the present disclosure, it is possible to shorten the time required for the evaluation of the recipe while suppressing the increase in the data amount.

BRIEF DESCRIPTION OF DRAWINGS

FIG. 1 is a configuration diagram illustrating an example of a charged particle beam device.

FIG. 2 is a diagram illustrating a weighted average image generation method.

FIG. 3 is a flowchart illustrating an example of a feature amount data calculation method.

FIG. 6 is a flowchart illustrating an example of a method for generating a pseudo image.

FIG. 10 is a diagram illustrating a secondary electron intensity distribution of a frame image including a saturated brightness value.

FIG. 11 is a flowchart illustrating an example of a method for generating the charging drift image.

FIG. 12 is a flowchart illustrating an inspection process flow of one lot in a defect review SEM.

FIG. 13 is a flowchart illustrating an example of a method for adjusting parameters of a defect detection process.

FIG. 14 is a flowchart illustrating an inspection process flow for replicating a low-magnification SEM image.

FIG. 15 is a flowchart illustrating an example of a method for adjusting the parameters of the defect detection process by using a replicated low-magnification SEM image.

FIG. 16 is a flowchart illustrating an example of a process for optimizing the number of imaging frames.

DESCRIPTION OF EMBODIMENTS

Figure 4A:
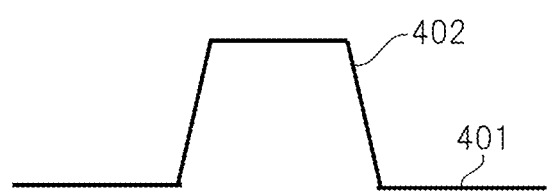
FIGS. 4A and 4B are diagrams schematically illustrating an example of a secondary electron signal intensity distribution with respect to a pattern cross section.

Hereinafter, embodiments of the present disclosure will be described with reference to the drawings. Each embodiment described below is an example for realizing the present disclosure, and does not limit the technical scope of the present disclosure. In the embodiments, members having the same function are denoted by the same reference numeral, and the redundant description thereof will be omitted unless particularly necessary.

First Embodiment

In the present embodiment, a pseudo image is generated by using a feature amount data calculated from a frame image, and a recipe evaluation or the like is performed by using the pseudo image.

<Configuration of Charged Particle Beam Device>

FIG. 1 is a configuration diagram illustrating an example of a charged particle beam device. Herein, the configuration of the charged particle beam device will be described by taking a scanning electron microscope as an example. As illustrated in FIG. 1, the scanning electron microscope (charged particle beam device) 200 includes an electron microscope 201, a computer system 202, and a display device 203.

The electron microscope 201 includes an electron source 204, a focusing lens 205, a deflector 206, an objective lens 207, a sample stage 209 on which the sample 208 is mounted, and a detector 210. The electron beam emitted from the electron source 204 is converged by the focusing lens 205 and the objective lens 207, and the sample 208 on the sample stage 209 is irradiated with the electron beam.

The deflector 206 deflects the electron beam according to a deflection signal output from the computer system 202. As a result, the electron beam is scanned on the sample 208 two-dimensionally. The detector 210 detects secondary electrons and backscattered electrons generated from the sample 208 and converts the detected secondary electrons (secondary particles) and backscattered electrons into the detection signal. The detection signal is output to the computer system 202.

As illustrated in FIG. 1, the computer system 202 includes a data processing unit 211, an image storage unit 212, an image processing unit 213, and a non-volatile memory 214.

The data processing unit 211 performs inputting and outputting of information between components of the data processing unit 211, inputting and outputting of information between the electron microscope 201 and the display device 203, and the like.

The data processing unit 211 generates, for example, control signals (for example, a deflection signal and the like) that control components of the electron microscope 201. For example, the data processing unit 211 generates a signal for adjusting a bias and range of the detector 210 so that the detection signal output from the detector 210 falls within a predetermined dynamic range.

It is noted that the adjustment of the bias and range may be performed by, for example, ABC (Auto Bias Control) control by using hardware or may be performed by the ABC by using software.

In addition, the data processing unit 211 receives various signals such as a detection signal and a response signal with respect to a control signal from the electron microscope 201. For example, the data processing unit 211 generates a frame image based on the detection signal and stores the generated frame image in the image storage unit 212.

In addition, the data processing unit 211 outputs an image data to be displayed on the display device 203. The image data includes, for example, an image data of the frame image, an image data after the image processes in the image processing unit 213 described later, and the like.

The image processing unit 213 performs image processes based on the frame image. For example, the image processing unit 213 generates a weighted average image 310 (FIG. 2) based on a plurality of the frame images stored in the image storage unit 212. The processes performed by the image processing unit 213 will be described later.

The display device 203 is a device that displays various information of a scanning electron microscope 200. The display device 203 displays, for example, setting information of the scanning electron microscope 200, information indicating an operating status, a frame image, an image-processed image, and the like. In addition, the display device 203 may have a function as an input device such as a touch panel. In this case, the display device 203 displays a user interface for inputting information.

FIG. 2 is a diagram illustrating a weighted average image generation method. The image processing unit 213 generates the weighted average image 310 by adding all the results of integrating weights w1, w2, . . . , wk (w1+w2+ . . . +wk=1) arbitrarily set for the respective frame images of the first frame image 310_1, the second frame image 310_2, . . . , and up to the k-th frame image 310_k. The image processing unit 213 can generate an average image 102 from a plurality of the frame images by setting the respective weights as w1=w2= . . . =wk=1/k.

The image processing unit 213 generates the feature amount data from the frame images and stores the generated feature amount data in the image storage unit 212. The feature amount data will be described in detail later.

In addition, the image processing unit 213 pseudo generates a simulation image by performing simulation by using the feature amount data stored in the image storage unit 212 and stores the generated simulation image in the image storage unit 212. It is noted that, in the following, in some cases, the simulation image may be referred to as a pseudo image.

The data processing unit 211 and the image processing unit 213 are realized, for example, by executing the program stored in the non-volatile memory 214 by the processor such as a CPU. In addition, some of the functions of the data processing unit 211 and the image processing unit 213 may be configured by dedicated hardware. At this time, the image storage unit 212 can be provided as a memory connected to, for example, the CPU or the like. In this case, the CPU may read each program from the non-volatile memory 214 and expand the program in the built-in memory when performing necessary processes.

<Feature Amount Data Calculation>

FIG. 3 is a flowchart illustrating an example of a feature amount data calculation method. The feature amount data calculated herein are, for example, the average, the standard deviation, the kurtosis, and the skewness of the frame image.

These feature amount data are calculated in units of a pixel. The flow of FIG. 3 includes steps S501 to S507. In step S501, the electron microscope 201 scans the sample 208 with an electron beam in a predetermined number of times specified in advance.

In step S502, the data processing unit 211 generates a frame image each time the sample 208 is scanned with the electron beam and stores the generated frame image in the image storage unit 212. Then, the image processing unit 213 calculates the position variation amount between the frame images by comparing a plurality of the frame images with each other. Then, the image processing unit 213 corrects each frame image by using the calculated position variation amount.

In step S503, the image processing unit 213 calculates the N-th moment image by using the N-th power average image of the frame image.

First, the image processing unit 213 calculates the first-power average image <Img1>, the second-power average image <Img2>, the third-power average image <Img3>, and the fourth-power average image <Img4> of the frame image by using the corrected frame image as an intermediate image.

The first-power average image <Img1> of the frame image is represented by the following formula (1). The second-power average image <Img2> of the frame image is represented by the following equation (2). The third-power average image <Img3> of the frame image is represented by the following equation (3). The fourth-power average image <Img4> of the frame image is represented by the following equation (4). In the equations (1) to (4), [i, j] indicates the pixel position on the frame image, N indicates the number of frame images, and the frame image k indicates the frame image of the k-th frame.

$$< Img1 > [i, j] = (1/N) \times \Sigma\{k = 1, \ldots, N\} \text{Frame Image } k[i, j] \quad (1)$$

$$< Img2 > [i, j] = (1/N) \times \Sigma\{k = 1, \ldots, N\} \text{Frame Image } k[i, j]^2 \quad (2)$$

$$< Img3 > [i, j] = (1/N) \times \Sigma\{k = 1, \ldots, N\} \text{Frame Image } k[i, j]^3 \quad (3)$$

$$< Img4 > [i, j] = (1/N) \times \Sigma\{k = 1, \ldots, N\} \text{Frame Image } k[i, j]^4 \quad (4)$$

Hereinafter, in the same manner, the image processing unit 213 can calculate up to the N-th power average image <ImgN>[i,j] of the frame image N.

Next, the image processing unit 213 calculates the N-th moment image of the frame image based on the first-power to fourth-power average images calculated by the equations (1) to (4) and further based on the N-th power average image. The first-order moment image of the frame image is represented by the following equation (5). The second-order moment image of the frame image is represented by the following equation (6). The third-order moment image of the frame image is represented by the following equation (7). The fourth-order moment image of the frame image is represented by the following equation (8).

$$\text{First-Order Moment Image}[i, j] = < Img1 > [i, j] \quad (5)$$

$$\text{Second-Order Moment Image}[i, j] = < Img2 > [i, j] - < Img1 > [i, j]^2 \quad (6)$$

$$\text{Third-Order Moment Image}[i, j] = < Img3 > [i, j] - 3 < Img2 > [i, j] \times < Img1 > [i, j] + 2 < Img1 > [i, j]^3 \quad (7)$$

$$\text{Fourth-Order Moment Image}[i, j] = < Img4 > [i, j] - 4 \times < Img3 > [i, j] \times < Img1 > [i, j] + 6 \times < Img2 > [i, j] \times < Img1 > [i, j]^2 - 3 < Img1 > [i, j]^4 \quad (8)$$

The N-th moment image can be calculated by using the expansion formula (9) of the binomial theorem illustrated below.

$$(a + b)^N = \Sigma\{k = 0, \ldots, N\}_N C_k \times a^k \times b^{(N-k)} \quad (9)$$

Next, the image processing unit 213 performs calculation of the average image (S504), calculation of the standard deviation image (S505), calculation of the kurtosis image (S506), and calculation of the skewness image (S507) by using the respective moment images.

The average image in step S504 is calculated by the following formula (10).

$$\text{Average Image}[i, j] = \text{First-Order Moment Image}[i, j] \quad (10)$$

The standard deviation image in step S505 is calculated by the following equation (11).

$$\text{Standard Deviation Image}[i, j] = \sqrt{\text{Second-Order Moment Image}[i, j]} \quad (11)$$

The skewness image in step S507 is calculated by the following equation (12).

$$\text{skewness Image}[i, j] = \text{Third-Order Moment Image}[i, j] \div \text{Standard Deviation Image}[i, j]^3 \quad (12)$$

The kurtosis image in step S506 is calculated by the following equation (13).

$$\text{kurtosis Image}[i, j] = \text{Fourth-Order Moment Image}[i, j] \div \text{Standard Deviation Image}[i, j]^4 - 3 \quad (13)$$

The order of steps S504 to S507 can be changed as appropriate. When the processes of steps S504 to S507 are completed, the feature amount data calculation process is completed.

Herein, an example of calculating up to the fourth-order moment image is illustrated. By using up to the fourth-order moment image, it is possible to maintain the calculation accuracy of the feature amount while minimizing the load on the image processing unit 213.

<Signal Generation Process in SEM Image>

Figure 4B:
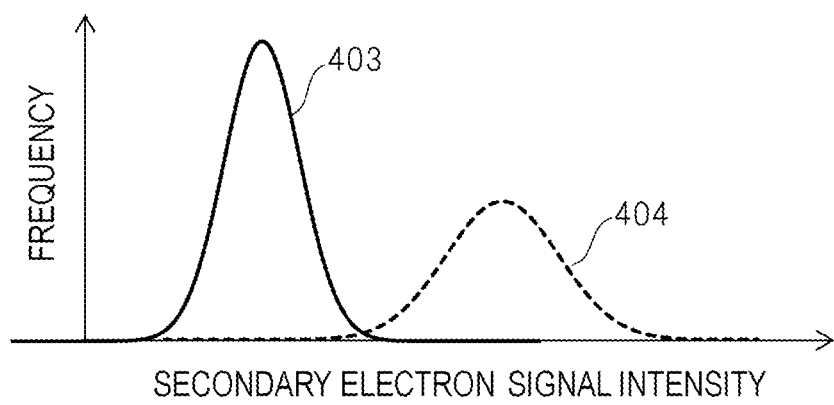

Herein, the signal generation process in the SEM image will be described. FIGS. 4(a) and 4(b) are diagrams schematically illustrating an example of the secondary electron signal intensity distribution with respect to the pattern cross section. FIG. 4(a) illustrates a pattern cross section of the sample. In FIG. 4(a), reference numeral 401 is a non-patterned edge portion, and reference numeral 402 is a patterned edge portion. FIG. 4(b) illustrates the secondary electron signal intensity distribution. In FIG. 4(b), the horizontal axis is the secondary electron signal intensity and the vertical axis is the frequency. In FIG. 4(b), reference numeral 403 is the secondary electron signal intensity distribution of the non-patterned edge portion 401, and 404 is the secondary electron signal intensity distribution of the patterned edge portion 402.

The secondary electrons of the SEM are likely to be generated from the non-patterned edge portion 401 due to the edge effect. On the other hand, there is a characteristic that the number of secondary electrons of the SEM generated from the patterned edge portion 402 is smaller than that of the non-patterned edge portion 401. It is assumed that the probability of generation of the secondary electrons follows a random process, and the occurrence frequency of the secondary electrons follows a normal distribution.

In the present embodiment, as described above, the feature amount data (average, standard deviation, skewness, and kurtosis) obtained by extracting the characteristics of the probability distribution in units of a pixel from N frame images can be obtained. The pixels on the average image corresponding to the patterned edge portion 401 are, for example, the pixels 320 of the edge portion illustrated in FIG. 2. The pixels on the average image corresponding to the non-patterned edge portion 402 are the pixels 330 of the non-edge portion illustrated in FIG. 2.

Similarly, with respect to the first frame image, the pixel corresponding to the non-patterned edge portion 401 is the pixel 330_1, and the pixel corresponding to the patterned edge portion 402 is the pixel 320_1. With respect to the second frame image, the pixel corresponding to the non-patterned edge portion 401 is the pixel 330_2, and the pixel corresponding to the patterned edge portion 402 is the pixel 320_2. With respect to the k-th frame image, the pixel corresponding to the non-patterned edge portion 401 is the pixel 330_k, and the pixel corresponding to the patterned edge portion 402 is the pixel 320_k.

If the number of frame images is sufficiently large, the secondary electron signal intensity distribution 403 of the non-patterned edge portion 401 and the secondary electron signal intensity distribution 404 of the patterned edge portion 402 on the frame image follow a normal distribution.

If it is assumed that the secondary electron signal intensity distribution follows a normal distribution, an SEM image of an arbitrary K-th frame can be simulated in a pseudo manner as a simulation image (pseudo image) from the central limit theorem. In addition, it is possible to generate integrated images of a plurality of the frames from the pseudo images of each frame in a pseudo manner.

It is noted that the central limit theorem denotes that when calculating an average of sampling data according to a continuous probability distribution, a variation in the average value converges on a value obtained by dividing a square root of the number of times of sampling with a standard deviation of a population.

<Pseudo Image Generation Method>

Figure 5A:
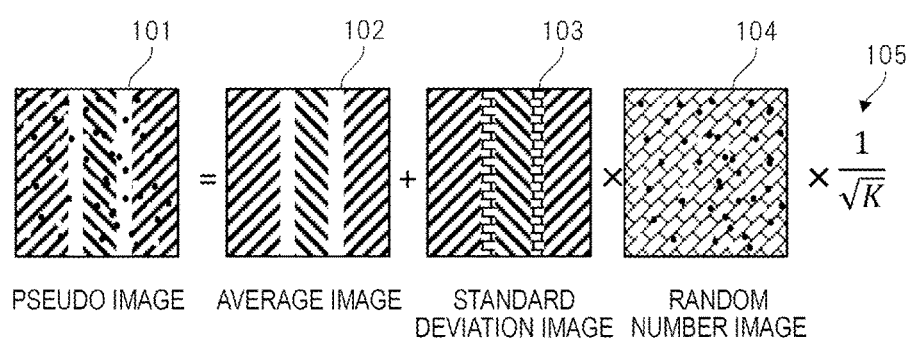
FIGS. 5A and 5B are diagrams illustrating a method for generating a pseudo image.
Figure 5B:
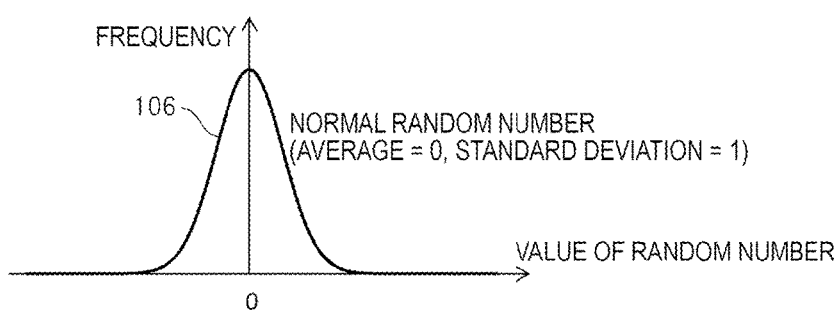

Next, a pseudo image generation method will be described. FIGS. 5(a) and 5(b) are diagrams illustrating the pseudo image generation method. FIG. 5(a) illustrates a conceptual diagram of pseudo image generation. In FIG. 5(a), reference numeral 101 is a pseudo image. Reference numeral 102 is an average image. Reference numeral 103 is a standard deviation image. Reference numeral 104 is a random number image. Reference numeral 105 is a correction coefficient. The correction coefficient 105 is, for example, a value defined by the reciprocal of the square root of the number of frames (K) used to generate the pseudo image, as illustrated in FIG. 5. FIG. 5(b) illustrates the distribution 106 of normal random numbers. The normal random number has the characteristics of average=0 and standard deviation=1.

FIG. 6 is a flowchart illustrating an example of a pseudo image generation method. In the example of FIG. 6, steps S1001 to S1004 are executed when the pseudo image is generated. In step S1001, the image processing unit 213 generates the random number image 104 illustrating the occurrence frequency distribution of the secondary electrons by using the normal random numbers 106. In step S1002, the image processing unit 213 calculates the correction coefficient 105.

Then, the image processing unit 213 multiplies the standard deviation image 103, the random number image 106, and the correction coefficient 105 (step S1003), adds the average image 102 to the one calculated in step S1003, and generates a pseudo image 101 in the K-th frame (S1004). It is noted that the product of a standard deviation image 103 and the correction coefficient 105 is the variation (standard deviation) of the integrated image in the K-th frame.

The same processes can be performed by randomly selecting K frame images used for calculating the feature amount data and averaging the feature amount data, but the capacity required for storing the image data becomes enormous, so that the processes are not realistic. In addition, the image process becomes enormous, and the load applied to the image processing unit 213 becomes large.

The pseudo image generated in this manner is used, for example, as an image for pattern matching or recipe evaluation.

The pseudo image is generated from the average image, the standard deviation image, and the random number image based on a plurality of the frame images. According to this configuration, an image for the recipe evaluation is generated with only a few (three) images. Therefore, it is possible to shorten the generation time of the image for the recipe evaluation. Therefore, it is possible to shorten the time required for the recipe evaluation while suppressing an increase in the data amount.

In addition, according to the present embodiment, since it is possible to generate the pseudo image of the SEM image in which the imaging conditions are changed based on the feature amount data, the evaluation of the recipes having different conditions can be efficiently executed without a device. In addition, damage to the sample is suppressed, and reproducibility is improved, so that it is possible to perform integration evaluation by integrating a plurality of the frames.

In addition, by using the pseudo image, it is possible to optimize and set various parameters for measurement, or the like, without depending on the experience of the application engineer. In addition, even when the design data is used, the reproducibility caused by noise can be predicted from the pseudo image, and the measurement for the sample confirmation can be omitted.

Second Embodiment

Next, a second embodiment will be described.

The imaging time of the SEM image is shortened by reducing the number of frames, so that it is possible to speed up the defect review. However, there is a problem that it is difficult to estimate the decrease in the defect detection rate when reducing the number of frames and, since it is necessary to monitor the defect detection rate by re-executing the recipe, the number of working processes for the optimization of the image processing parameters increases.

Furthermore, determination as for whether or not the number of frames of the captured image is optimum and the signal-to-noise (S/N) ratio is sufficiently is performed by visually checking detected position of the measurement edge. When fine defects and foreign substances are detected, working of visually checking whether this is a fact is required.

In addition, when optimizing the image processing parameters for detecting the defects from the SEM images containing much more noise with a defect captured, it is necessary to acquire much more SEM images. There is a problem that the working processes of the optimization of acquiring the repetitive SEM images are required, but also the visibility of the defects changes due to so-called contamination marks (contamination), so that it is difficult to optimize the image processing parameters with good reproducibility.

Figure 7A:
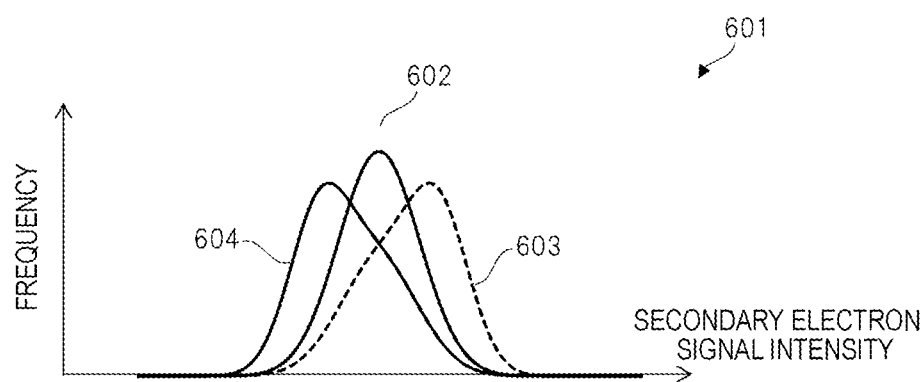
FIGS. 7A and 7B are diagrams schematically explaining characteristics of skewness and kurtosis.
Figure 7B:
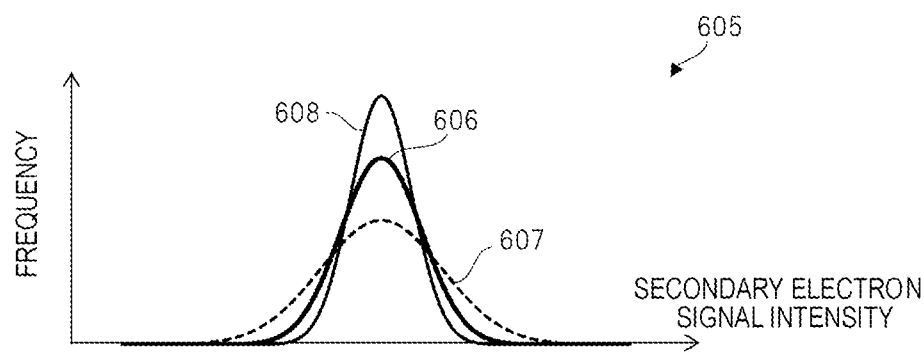

Therefore, in the present embodiment, the frame integration number is optimized by using the skewness and the kurtosis. FIGS. 7(a) and 7(b) are diagrams schematically illustrating the characteristics of the skewness and the kurtosis. FIG. 7(a) illustrates the characteristics 601 of the skewness, and FIG. 7(b) illustrates the characteristics 605 of the kurtosis. It is noted that, in FIG. 7(a) and the FIG. 7(b), the horizontal axis represents the secondary electron signal intensity, and the vertical axis represents the frequency.

It is generally known that, in the normal distribution, the skewness and kurtosis values are zero. In FIG. 7(a), when the occurrence frequency distribution of the skewness becomes a distribution 603 that is positively biased from a normal distribution 602, the kurtosis has a negative value. On the other hand, when the occurrence frequency distribution of the skewness is a distribution 604 that is negatively biased from the normal distribution 602, the kurtosis has a positive value.

In FIG. 7(b), when the occurrence frequency distribution of the kurtosis becomes a distribution 607 with a bulging hem from the normal distribution 606, the skewness has a positive value. On the other hand, when the occurrence frequency distribution of the kurtosis becomes a distribution 608 with a shrunken tail from the normal distribution 606, the skewness has a negative value.

Next, a method for optimizing the frame integration number using such characteristics of the skewness and kurtosis will be described. It is known that the secondary electron signal intensity distribution for the frame integration number follows approximately a Poisson distribution, and when the frame integration number is sufficient, the secondary electron signal intensity distribution approaches a normal distribution according to the central limit theorem. When the secondary electron signal intensity distribution follows a normal distribution, as described above, the kurtosis and the skewness become zero. Therefore, by determining whether or not the kurtosis and the skewness are values close to zero, it is possible to optimize the frame integration number.

Specifically, the image processing unit 213 can determine whether or not the frame integration number is optimal by determining whether or not each of the kurtosis and the skewness has a predetermined threshold value or less that is set in advance.

For example, when the kurtosis and the skewness are larger than a predetermined threshold value set in advance, as a frame integration number is not sufficient, the frame image is subsequently obtained. On the other hand, when the kurtosis and the skewness are less than a predetermined threshold value, as the frame integration number is sufficient, the acquisition of the frame images is stopped. Thus, by determining the kurtosis and the skewness, it is possible to optimize the frame integration number.

In addition, the optimization process of the frame integration number can be performed even at the time of the recipe execution. At the time of the recipe execution, the image processing unit 213 can calculate the kurtosis and the skewness of the integrated image each time acquiring the frame image, can determine whether or not the frame integration number is optimal by comparing the calculated the kurtosis and the skewness with a predetermined threshold value, and can change the frame integration number.

According to the present embodiment, it is possible to optimize the frame integration number in the scanning electron microscope (charged particle beam device) 200 by using the skewness and kurtosis. Therefore, the confirmation work or the like by the worker is not necessary, and it is possible to perform the optimization process for the frame integration number in a short time.

In addition, whether or not the number of frames of the captured image is optimal or whether or not the S/N ratio is sufficient can be checked at the time of recipe registration. In addition, a work for visually checking the detection position of the measurement edge, a work for visually checking whether or not fine defects and foreign substances are false alarms and the like are not required.

In addition, it is possible to easily calculate the minimum frame integration number required for pattern detection by using the pseudo image instead of the SEM image (frame image) in pattern matching with the registered guide pattern image.

Third Embodiment

Next, a third embodiment will be described.

For example, the pattern dimension measurement by CD-SEM can be continuously performed automatically in accordance with a recipe including the position of the measurement point on the semiconductor wafer, the SEM observation condition, the pattern image measurement parameters serving as a guide for specifying the measurement position, and the like. Specifically, the SEM image can be acquired by moving the CD-SEM to the measurement pattern position according to recipe information and scanning the pattern with registered SEM observation conditions. After the processes based on the measurement parameters of the threshold value or the like for determining the smoothing size and the edge position of the noise removal filter with respect to the acquired SEM image are performed, the distance between the two edge portions of the measurement pattern is measured.

The determination of threshold value for determining the smoothing size and the edge position of the noise removal filter depends on the noise amount of the SEM image and the edge shape of the pattern. For this reason, the optimization of the measurement parameters depends on largely the experience of application engineers. In addition, it is difficult to explain the basis of the measurement parameters set in the past.

Furthermore, since it is necessary to register the measurement parameters in advance, even if the position of the desired pattern can be specified by using the design data, it is necessary to confirm the reproducibility in the case of repeatedly performing the edge detection of the measurement pattern.

The CD-SEM accurately detects the measurement position by moving the stage to the measurement pattern position according to the recipe information and, after that, performing pattern matching of the registered guide pattern image with the acquired image. In order to improve throughput, although it is desirable to perform the acquisition of the SEM image in a short time, the number of working processes for the optimization of the measurement parameters increases due to the influence of the contrast and noise amount of the image.

Therefore, in the present embodiment, a plurality of the random number images 106 according to the distribution of the standard deviation image 103 in the generation of the pseudo image are prepared, so that a plurality of the pseudo images having different white noises are generated.

By using a plurality of the pseudo images, the threshold value for determining the spatial smoothing size in the pattern measurement process and the edge detection position offline, that is, in the apparatus, can be easily optimized.

In addition, similarly, it is possible to optimize the threshold values by, for example, performing pattern matching to specify the pattern measurement position and performing the determination as to whether or not the pattern matching succeeds by using a plurality of pseudo images.

Fourth Embodiment

Next, a fourth embodiment will be described. At the time of the frame integration, a shrinkage phenomenon in which a pattern of the sample 208 shrinks may occur due to long-time irradiation with the electron beam. When the shrinkage phenomenon occurs, the reproducibility of the recipe execution result is reduced. The shrinkage phenomenon is prominent in, for example, the resist material or the like. Therefore, in the present embodiment, the detection of shrinkage phenomena is performed by using the kurtosis and the skewness of the feature amount data.

Figure 8A:
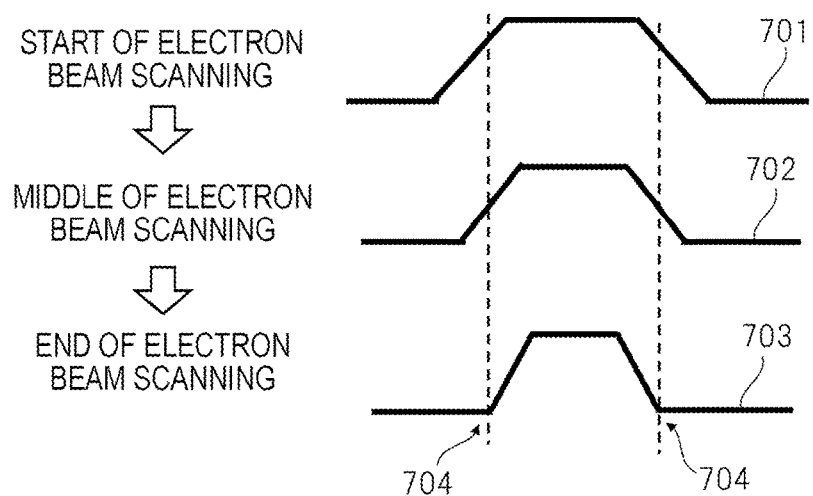
FIGS. 8A and 8B are diagrams illustrating a state at the time of occurrence of shrink.
Figure 8B:
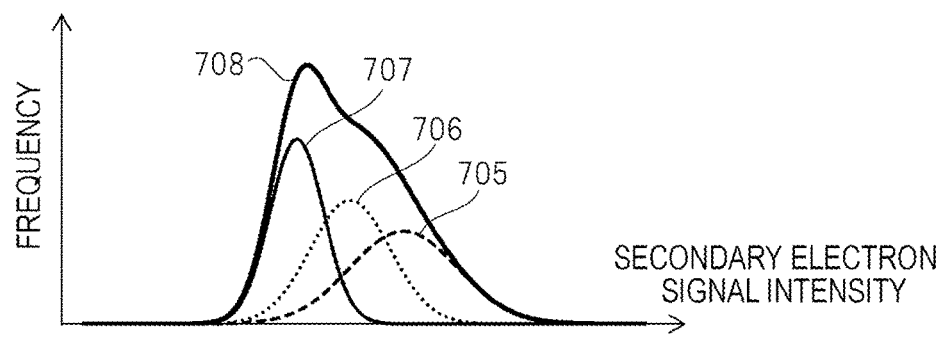

FIGS. 8(a) and 8(b) are diagrams illustrating a state at the time of occurrence of the shrinkage. FIG. 8(a) illustrates a pattern cross-sectional change at the time of occurrence of the shrinkage. FIG. 8(b) illustrates a frequency histogram changes in the secondary electron signal intensity in the patterned contour portion at the time of occurrence of the shrinkage.

As illustrated in FIG. 8(a), when the shrinkage is generated, the pattern width of the pattern cross section of the sample 208 gradually decreases from a pattern cross section 701 at the time of start of the electron beam scanning, through a pattern cross section 702 in the middle of the electron beam scanning, to a pattern cross section 703 at the time of end of the electron beam scanning.

At this time, the occurrence frequency of the secondary electrons in the patterned contour portion 704 becomes a composite distribution 708 obtained by composing a probability distribution (normal distribution) 705 of occurrence of the secondary electrons in the edge portion of the pattern cross section 701 at the time of start of the electron beam scanning, a probability distribution (normal distribution) 706 of occurrence of the secondary electrons in the edge portion of the pattern cross section 702 in the middle of the electron beam scanning, and a probability distribution (normal distribution) 707 of occurrence of the secondary electrons in the edge portion of the pattern cross section 703 at the time of end of the electron beam scanning. Thus, the probability distribution at the time of occurrence of the shrinkage is in a state of deviating from a normal distribution (FIG. 8(b)).

In the composite distribution 708 that deviates from the normal distribution, the skewness and the kurtosis have non-zero values, so it is possible to detect which portion of the pattern in the image has shrunk. Thus, when detecting the shrink at the time of the recipe registration, reducing the frame integration number, or calculating the shrinkage amount, it is possible to take measures such as switching to a mode of reflecting the shrinkage amount of the measured value.

According to the present embodiment, it is possible to automatically detect the shrinkage phenomenon of pattern, and it is possible to perform appropriate processes at the time of the recipe registration or at the time of the recipe execution.

Fifth Embodiment

Next, a fifth embodiment will be described.

At the time of the frame integration, a charging drift phenomenon in which the sample 208 is charged and image drift occurs and a stage drift phenomenon in which the image drift occurs by an inertia immediately after stoppage of the sample stage 209 occurs due to long-time irradiation with the electron beam. When the image drift phenomenon occurs, the reproducibility of the recipe execution result is reduced. In the present embodiment, a method for detecting the image drift phenomenon will be described.

Figure 9A:
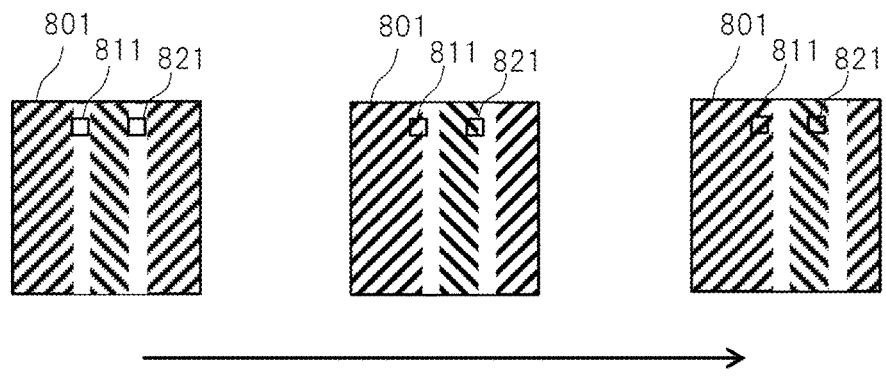
FIGS. 9A to 9C are diagrams illustrating a state at the time of occurrence of an image drift phenomenon.
Figure 9B:
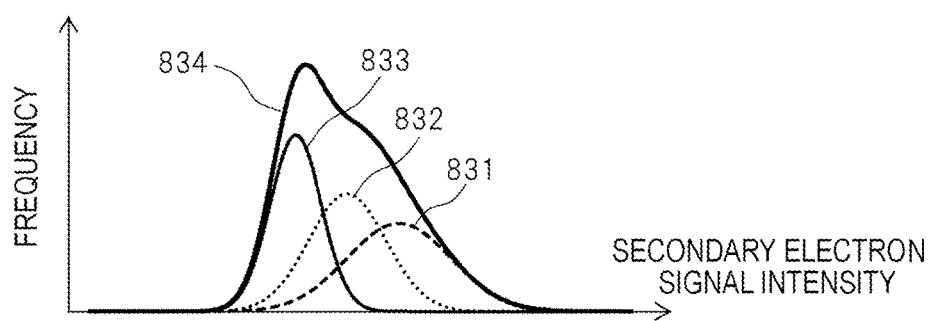
Figure 9C:
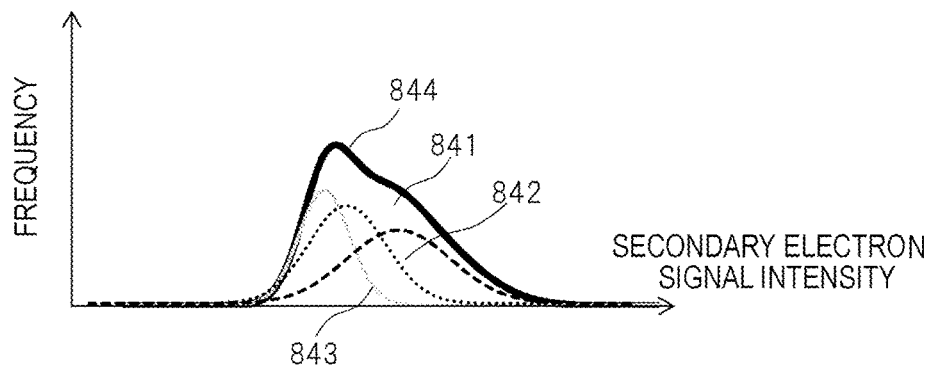

FIGS. 9(a) to 9(c) are diagrams illustrating a state at the time of occurrence of an image drift phenomenon. FIG. 9(a) illustrates the frame image at the time of occurrence of the image drift phenomenon. FIG. 9(b) illustrates the frequency histogram change of the secondary electron signal intensity at the left edge portion. FIG. 9(c) illustrates the frequency histogram change of the secondary electron signal intensity at the right edge portion.

As illustrated in FIG. 9(a), when the image drift phenomenon occurs, the pattern is observed so that the frame image moves in parallel in the order of the frame image 801 at the time of starting the electron beam scanning, the frame image 802 in the middle of the scanning, and the frame image 803 at the time of ending the scanning.

On the other hand, in the pixel 811 of the left edge portion and the pixel 821 of the right edge portion designated by the frame image 801 at the time of starting the electron beam scanning, the brightness value is sequentially changed as in the frame images 802 and 803 according to the movement of the pattern.

At this time, the occurrence frequency of the secondary electrons at the left edge portion of the pattern becomes a composite distribution 834 obtained by composing a probability distribution (normal distribution) 831 of occurrence of the secondary electrons at the time of start of the electron beam scanning, a probability distribution (normal distribution) 832 of occurrence of the secondary electrons in the middle of the scanning, and a probability distribution (normal distribution) 833 of occurrence of the secondary electrons at the time of end of the scanning. Thus, the probability distribution of the left edge portion at the time of occurrence of the image drift is in a state of deviating from a normal distribution (FIG. 9(b)).

Similarly, the occurrence frequency of the secondary electrons at the right edge portion of the pattern becomes a composite distribution 844 obtained by composing a probability distribution (normal distribution) 841 of occurrence of the secondary electrons at the time of start of the electron beam scanning, a probability distribution (normal distribution) 842 of occurrence of the secondary electrons in the middle of the scanning, and a probability distribution (normal distribution) 843 of occurrence of the secondary electrons at the time of end of the scanning. In this manner, the probability distribution at the right edge portion at the time of occurrence of the image drift also deviates from the normal distribution (FIG. 9(*c*)).

At this time, similarly to the detection of the shrinkage phenomenon described above, the composite distribution 834 on the left edge portion and the composite distribution 844 on the right edge portion deviate from the normal distribution, and thus, the skewness and the kurtosis have non-zero values. By doing so, it is possible to detect a change in the brightness of the pattern in the frame image.

Furthermore, by comparing the change in the brightness value of the left edge portion with the change in the brightness value of the right edge portion, it is possible to distinguish and detect whether the image drift phenomenon has occurred or whether the shrinkage phenomenon has occurred. The data as a comparison target at that time are the variation value, the skewness, the kurtosis, or the like of the normal distribution.

When the image drift phenomenon is detected at the time of the recipe execution, the image processing unit 213 calculates the drift amount and generates an image drift image in which the frame image is corrected based on the drift amount. In addition, the image processing unit 213 recalculates the average image by using the image drift image. Then, the image processing unit 213 calculates a pseudo image by using the recalculated average image.

<<Method for Generating Charging Drift Image>>

Herein, a method for generating the charging drift image as an image drift image will be described. FIG. 11 is a flowchart illustrating an example of the method for generating the charging drift image. FIG. 11 includes steps S1101 to S1107.

In step S1101, the image processing unit 213 generates an integrated image with a plurality of the frame images. However, since the first frame image is still generated at this stage, the brightness of each pixel in the integrated image is zero.

In steps S1102 to S1106, the processes are performed for each frame image. In step S1103, the data processing unit 211 generates the frame image and stores the generated frame image in the image storage unit 212. In step S1104, the image processing unit 213 calculates the feature amount data from the frame image generated in step S1103. Then, the image processing unit 213 compares the calculated feature amount data with the feature amount data when the charging drift phenomenon does not occur and calculates the feature amount data deviation amount of the frame image. In addition, a transmission processing unit 213 may calculate a feature amount data deviation amount by comparing with the feature amount data in the immediately preceding frame image.

In step S1105, the image processing unit 213 performs a process of translating the image based on the calculated feature amount data deviation amount to generate a translated image.

In step S1106, the integrated image up to the immediately preceding frame and the translation image generated in the current frame are integrated to generate anew integrated image. Then, the integrated image generated in step S1106 with respect to the last frame image becomes a charging drift image (step S1107).

According to the present embodiment, due to charging phenomenon, the image drift and drift at the time of the image drift stoppage can be automatically detected, and appropriate processes can be performed at the time of the recipe registration or at the time of the recipe execution.

Sixth Embodiment

Next, a sixth embodiment will be described.

In a general recipe, the frame image is acquired after the bias and range of the detector 210 are controlled by the hardware ABC so that the detection signal falls within a predetermined dynamic range. It is noted that, in order to improve the throughput, there exists also a recipe in which the hardware ABC process is omitted by setting the bias and range pre-registered in advance in the detector 210.

However, in some cases, the emission amount of the secondary electrons may fluctuate greatly depending on the material of the sample. Therefore, in some cases, the secondary electron detection signal may not fall in the dynamic range of the system, the brightness value of a portion of the frame image (pixel) may be saturated, and an appropriate image may not be obtained. Therefore, in the present embodiment, the bias and the range are reset.

FIG. 10 is a diagram illustrating the secondary electron intensity distribution of the frame image including the saturated brightness value. When the brightness values in the image are not within the dynamic range and a portion of the brightness values are saturated, the secondary electron intensity distribution is, for example, the distribution illustrated in FIG. 6. Reference numeral 902 is a secondary electron signal intensity distribution of the non-edge portion. Reference numeral 903 is a secondary electron signal intensity distribution of the edge portion. Since all of the distributions deviate from a normal distribution, the skewness and the kurtosis have non-zero values.

In addition, by separately calculating the distribution 902 of the non-edge portion and the distribution 903 of the edge portion, it can be determined whether the distributions are saturated at the minimum value or the maximum value of the dynamic range.

According to the present embodiment, when saturation of the brightness value is detected in the frame image acquired by setting the pre-registered bias and range in the detector 210 at the time of the recipe execution, it is possible to acquire the frame image in which the brightness value is not saturated by adding a sequence of re-executing the bias and the range by the hardware ABC.

Seventh Embodiment

Next, a seventh embodiment will be described.

In the present embodiment, a method for evaluating recipe conditions by using an SEM image in which a defect review target will be described. First, the definition of the defect inspection flow and the defect detection rate of the defect review and the overview of the parameter adjustment of the defect detection process will be described. After that, the method for evaluating the recipe conditions related to the defect inspection by using the pseudo image will be described as a specific example.

FIG. 12 is a flow diagram illustrating an inspection process flow of one lot in the defect review SEM. FIG. 12 includes steps S1201 to S1209. In the inspection, a semiconductor wafer loading process (S1201) is followed by an alignment process (S1202). The alignment process is a process of detecting alignment marks on a semiconductor wafer and correcting the coordinates. In the alignment process, at least two or more alignment marks are detected.

Next, the following steps S1203 to S1209 are repeatedly executed for each defect review target on the semiconductor wafer. It is assumed that the position and size of the defect review target on the semiconductor wafer are known through the inspection by the inspection device in the previous stage. First, the field of view is moved to the defect review position (S1203).

Since the defect review position measured by the inspection device in the previous stage includes a measurement error, first, a low-magnification SEM image in which the defect review position is in the field of view is captured (S1204), and the captured image is stored in, for example, the image storage unit 212 of the computer system 202 (S1205).

The image processing unit 213 executes an image process (defect detection process) for detecting the defect review target on the low-magnification SEM image (S1206). The image processing unit 213 calculates the position variation amount defined by the size of the defect review target and the difference between the detected position of the defect review target and the center of the SEM image according to the image processing result.

Then, the computer system 202 adjusts the deflection amount of the electron beam so that the defect review target appears in the center of the image based on the position variation amount (S1207). After adjusting the deflection amount of the electron beam, a high-magnification SEM image is captured (S1208), and the captured image is stored in the image storage unit 212 (S1209). When the processes for all defect review targets are completed, the inspection process flow ends.

In the inspection process flow, the probability frequency of recognizing the position of a defect (defect review target) is called the defect detection rate. It is assumed that, when the defect detection position is included in the defective region, the defect detection position is correctly recognized.

In the semiconductor device inspection process, for example, an accuracy of a defect detection rate of 95% or more is required. The appearance of the SEM image (for example, the pattern shape of the non-defect portion, the sharpness of the defect, the S/N ratio (Signal-to-Noise ratio), or the like) differs depending on the type and material of the inspection process and the manufacturing device. Therefore, it is indispensable to appropriately adjust the parameters of the defect detection process in order to improve the accuracy of the defect detection rate.

Next, the method for adjusting the parameters of the defect detection process will be described. FIG. 13 is a flowchart illustrating an example of a method for adjusting the parameters of the defect detection process. FIG. 13 includes steps S1301 to S1305. Herein, it is assumed that the inspection process flow is performed in advance, and the low-magnification SEM image and the defect drawing region on the SEM image are taught.

First, the defect detection parameters are initially set (S1301). For the initial parameters, for example, parameters adjusted by using the SEM image close to the process of the inspection target are used. Next, the defect detection process of FIG. 12 is executed on the taught low-magnification SEM image by using the current parameters (S1302). The image processing unit 213 calculates the defect detection rate based on the defect detection result and the taught defect drawing region (S1303).

In step S1304, the image processing unit 213 determines whether or not to end the parameter adjustment of the defect detection process. When the defect detection rate is equal to or higher than a predetermined value (for example, 95%) (YES), the image processing unit 213 ends the parameter adjustment of the defect detection process. On the other hand, when the defect detection rate is less than 95% (NO), the image processing unit 213 updates the parameters by using the low-magnification defect image and the defect detection rate (S1305).

For the updating of the parameters, a parameter search method using an experiment design method or a method for selectively changing parameters that are highly sensitive to the defect detection rate is used. For example, in the case of the defect detection process by using deep learning, the parameters highly sensitive to the defect detection rate can be selectively changed by using an inverse error propagation method or a stochastic gradient descent method.

According to the present embodiment, it is possible to update the defect detection parameters according to the defect detection rate.

Eighth Embodiment

Next, an eighth embodiment will be described.

In the present embodiment, a defect inspection method using the feature amount data will be described. Specifically, the taught low-magnification SEM image is replicated by using the feature amount data described in the first embodiment. By doing so, it is possible to adjust the defect detection parameters with a small number of captured images.

In the present embodiment, the defect inspection flow of FIG. 12 and the adjustment flow of the defect detection parameter of FIG. 13 are extended.

FIG. 14 is a flow diagram illustrating an inspection process flow for replicating a low-magnification SEM image. FIG. 14 is similar to FIG. 12, but the main difference from FIG. 12 is that step S1410 is inserted between step S1204 and step S1205.

In step S1410, the image processing unit 213 calculates the feature amount data for each frame image by the method described in the first embodiment. Then, in step S1205 of FIG. 14, the feature amount data (feature amount data image) calculated in step S1410 is stored in the image storage unit 212. At that time, the corresponding frame image may be stored together with the feature amount data image.

FIG. 15 is a flowchart illustrating an example of a parameter adjustment method for the defect detection process by using a replicated low-magnification SEM image. FIG. 15 is similar to FIG. 13, but the main difference from FIG. 13 is that step S1506 is inserted between step S1301 and step S1302.

In step S1506, the image processing unit 213 pseudo replicates the low-magnification SEM image by using the feature amount data calculated in step S1410 of FIG. 14 with respect to the taught low-magnification SEM image.

Then, in step S1302, the image processing unit 213 executes the defect detection process of FIG. 14 by using the original SEM image, the SEM image replicated in step S1506, the currently set parameters, and the like.

Since the SEM image has characteristics that noise is likely to be added, it is necessary to acquire a large number of pseudo defect images by the defect inspection flow when adjusting the defect detection parameters with the teaching data containing a lot of noise.

On the other hand, in the present embodiment, since similar defect images having the same S/N ratio can be replicated, the teaching data for the parameter adjustment of the defect detection can be reduced, and thus, the teaching data can be collected in a short period of time.

According to the present embodiment, the pseudo SEM image is generated when searching for the parameter for recognizing a defect from the acquired SEM image. Therefore, it is possible to increase the teaching data and optimize the parameters.

Ninth Embodiment

Next, the ninth embodiment will be described.

In the present embodiment, a method for optimizing the imaging conditions so as to maintain the defect detection rate at a predetermined value (for example, 95%) or more by using the feature amount data described in the first embodiment will be described.

The defect inspection review requires an inspection flow that enables faster inspection while maintaining the defect detection rate. In order to speed up the defect inspection flow, it is indispensable to shorten the imaging time of the low-magnification SEM image.

Therefore, in the present embodiment, the number of imaging frames is optimized in order to shorten the imaging time of the low-magnification SEM image.

FIG. 16 is a flowchart illustrating an example of the optimization process for the number of imaging frames. FIG. 16 includes steps S1601 to S1606. As a precondition for the flow of FIG. 16, it is assumed that the defect inspection flow (FIG. 14) and the parameter adjustment of the defect detection (FIG. 15) of the eighth embodiment have been performed in advance.

First, the image processing unit 213 acquires the number of frames from the imaging conditions of the captured image acquired in the defect inspection flow and sets the number of imaging frames to the current number of frames (S1601). Then, by using the pseudo image generation method described in the first embodiment, the image processing unit 213 pseudo generates the SEM image (pseudo image) obtained by integrating the current number of frames (S1602).

The image processing unit 213 executes the defect detection process by using the SEM image pseudo generated in step S1602 (S1603). The image processing unit 213 calculates the defect detection rate by using the defect detection result and the defective region taught in advance (S1604).

In step S1605, the image processing unit 213 determines whether or not to end the adjustment of the number of imaging frames. When the defect detection rate is equal to or higher than a predetermined value (for example, 95%) (NO), the image processing unit 213 sets the number of imaging frames to half the current number and updates the number of imaging frames (S1606). At that time, the image processing unit 213 holds the number of imaging frames set immediately before. On the other hand, when the defect detection rate is less than 95% (YES), the image processing unit 213 returns the number of imaging frames to the number of imaging frames set immediately before and, after that, ends the adjustment of the number of imaging frames.

According to the present embodiment, the number of imaging frames can be set to the minimum number of imaging frames in which the defect detection rate becomes a predetermined value (for example, 95%) or more, and thus, the imaging time can be shortened.

REFERENCE SIGNS LIST

200: scanning electron microscope (charged particle beam device)
201: electron microscope
202: computer system
203: display device
211: data processing unit
212: image storage unit
213: image processing unit
214: non-volatile memory

The invention claimed is:

1. A charged particle beam device comprising:
a microscope that scans a charged particle beam on a sample, detects secondary particles emitted from the sample, and outputs a detection signal;
a computer system that generates a first frame image based on the detection signal and performs an image process based on the first frame image, wherein the computer system calculates a moment image between a plurality of frame images including the first frame image and calculates a feature amount data of the first frame image based on the moment image, and the computer system generates a plurality of simulation images having different white noises by using a plurality of random number images according to a distribution of standard deviation images and by using the feature amount data.

2. A charged particle beam device, comprising:
a microscope that scans a charged particle beam on a sample, detects secondary particles emitted from the sample, and outputs a detection signal;
a computer system that generates a first frame image based on the detection signal and performs an image process based on the first frame image, wherein the computer system calculates a moment image between a plurality of frame images including the first frame image and calculates a feature amount data of the first frame image based on the moment image, the feature amount data includes average, variation, skewness, and kurtosis, and the computer system generates a simulation image by performing simulation using the feature amount data.

3. The charged particle beam device according to claim 2, wherein the moment image includes an average image, a standard deviation image, a skewness image, and a kurtosis image.

4. The charged particle beam device according to claim 1, wherein the computer system calculates a position variation amount between the plurality of the frame images and corrects the first frame image based on the position variation amount.

5. The charged particle beam device according to claim 1, wherein the feature amount data includes average and variation.

6. A charged particle beam device comprising:
a microscope that scans a charged particle beam on a sample, detects secondary particles emitted from the sample, and outputs a detection signal;
a computer system that generates a first frame image based on the detection signal and performs an image process based on the first frame image, wherein the computer system calculates a moment image between a plurality of frame images including the first frame image and calculates a feature amount data of the first frame image based on the moment image, the feature amount data includes average, variation, skewness, and kurtosis, and the computer system performs optimization of an integrated number of the frame images based on values of kurtosis and skewness of the first frame image when an energy distribution of the secondary particles emitted from the sample follows a normal distribution.

7. A charged particle beam device comprising:
a microscope that scans a charged particle beam on a sample, detects secondary particles emitted from the sample, and outputs a detection signal;
a computer system that generates a first frame image based on the detection signal and performs an image process based on the first frame image,
wherein the computer system calculates a moment image between a plurality of frame images including the first frame image and calculates a feature amount data of the first frame image based on the moment image, the feature amount data includes average, variation, skewness, and kurtosis, and the computer system performs detection of a shrinkage phenomenon of the sample based on values of kurtosis and skewness of the first frame image when an energy distribution of the secondary particles emitted from the sample follows a normal distribution.

8. A charged particle beam device comprising:
a microscope that scans a charged particle beam on a sample, detects secondary particles emitted from the sample, and outputs a detection signal;
a computer system that generates a first frame image based on the detection signal and performs an image process based on the first frame image, wherein the computer system calculates a moment image between a plurality of frame images including the first frame image and calculates a feature amount data of the first frame image based on the moment image, the feature amount data includes average, variation, skewness, and kurtosis, and the computer system detects an image drift phenomenon of the sample based on values of kurtosis and skewness of the first frame image when an energy distribution of the secondary particles emitted from the sample follows a normal distribution.

9. A charged particle beam device comprising:
a microscope that scans a charged particle beam on a sample, detects secondary particles emitted from the sample, and outputs a detection signal;
a computer system that generates a first frame image based on the detection signal and performs an image process based on the first frame image, wherein the computer system calculates a moment image between a plurality of frame images including the first frame image and calculates a feature amount data of the first frame image based on the moment image, the feature amount data includes average, variation, skewness, and kurtosis, and the computer system resets a bias and a range of a detector that detects the secondary particles based on the values of the kurtosis and the skewness of the first frame image when an energy distribution of the secondary particles emitted from the sample follows a normal distribution and brightness values of a portion of pixels of the first frame image are saturated.

10. The charged particle beam device according to claim 1, wherein the computer system evaluates a recipe condition by a defect detection process using the first frame image in which a defect review target is captured, and when a defect detection rate is less than a predetermined value, a defect detection parameter set in the recipe conditions is updated.

11. The charged particle beam device according to claim 10, wherein the computer system calculates a feature amount data of the first frame image in which the defect review target is captured, generates a simulation image for defect detection by using the feature amount data, and performs the defect detection process by using the simulation image for the defect detection.

12. A charged particle beam device comprising:
a microscope that scans a charged particle beam on a sample, detects secondary particles emitted from the sample, and outputs a detection signal;
a computer system that generates a first frame image based on the detection signal and performs an image process based on the first frame image, wherein the computer system calculates a moment image between a plurality of frame images including the first frame image and calculates a feature amount data of the first frame image based on the moment image, and the computer system evaluates a recipe condition by a defect detection process using the first frame image in which a defect review target is captured and updates a number of imaging frames set in the recipe condition according to a defect detection rate.

13. The charged particle beam device according to claim 12, wherein the computer system updates the number of imaging frames set in the recipe condition to half the number when the defect detection rate is equal to or higher than a predetermined value.

14. The charged particle beam device according to claim 12, wherein when the defect detection rate is less than a predetermined value, the computer system returns the number of imaging frames set in the recipe condition to the number set immediately before.

* * * * *